US008428202B2

(12) United States Patent
Braicu et al.

(10) Patent No.: US 8,428,202 B2
(45) Date of Patent: Apr. 23, 2013

(54) RECEIVER WITH ANALOG AND DIGITAL GAIN CONTROL, AND RESPECTIVE METHOD

(75) Inventors: Bogdan Braicu, Villingen-Schwenningen (DE); Heinrich Schemmann, Villingen-Schwenningen (DE)

(73) Assignee: Thomson Licensing, Issy les Moulineaux (FR)

( * ) Notice: Subject to any disclaimer, the term of this patent is extended or adjusted under 35 U.S.C. 154(b) by 305 days.

(21) Appl. No.: 12/818,326

(22) Filed: Jun. 18, 2010

(65) Prior Publication Data

US 2010/0322360 A1    Dec. 23, 2010

(30) Foreign Application Priority Data

Jun. 19, 2009   (EP) .................................... 09305574

(51) Int. Cl.
*H04L 27/08* (2006.01)
(52) U.S. Cl.
USPC ...................................... 375/345; 455/226.2
(58) Field of Classification Search .................. 375/260, 375/345; 455/232.1, 234.1
See application file for complete search history.

(56) References Cited

U.S. PATENT DOCUMENTS

| 6,067,332 A * | 5/2000 | Taura et al. .................... 375/344 |
| 7,386,074 B1 | 6/2008 | Venkatesh et al. |
| 2003/0194981 A1 | 10/2003 | Rimini et al. |
| 2004/0264608 A1 | 12/2004 | Habuka et al. |
| 2006/0068733 A1 | 3/2006 | Wang et al. |
| 2006/0209216 A1* | 9/2006 | Okuma .......................... 348/725 |
| 2007/0058739 A1 | 3/2007 | Aytur et al. |
| 2007/0076828 A1 | 4/2007 | Choi et al. |
| 2011/0105070 A1* | 5/2011 | Li et al. ....................... 455/226.2 |

OTHER PUBLICATIONS

European Search Report dated Sep. 2, 2009 for Application No. EP 09 30 5574.

* cited by examiner

*Primary Examiner* — Leon-Viet Nguyen
(74) *Attorney, Agent, or Firm* — Tutunjian & Bitetto, P.C.

(57) ABSTRACT

The receiver comprises a first amplifier, a mixer for down-converting a wanted communications channel, a second amplifier, a demodulator and a digital controller providing a digital gain setting for the second amplifier by means a digital gain control after a selection of the wanted communications channel, and providing an analog gain setting for the first amplifier by means of an analog gain control during demodulation of the wanted communications channel. The digital gain setting is in particular freezed during demodulation of the wanted communications channel and the digital controller provides a re-calibration of the digital gain setting only, when the analog gain control is out of its control range. Applications are for example for direct conversion digital satellite receivers for reception of DVB-S, DVB-S2 or ABS-S television channels.

14 Claims, 1 Drawing Sheet

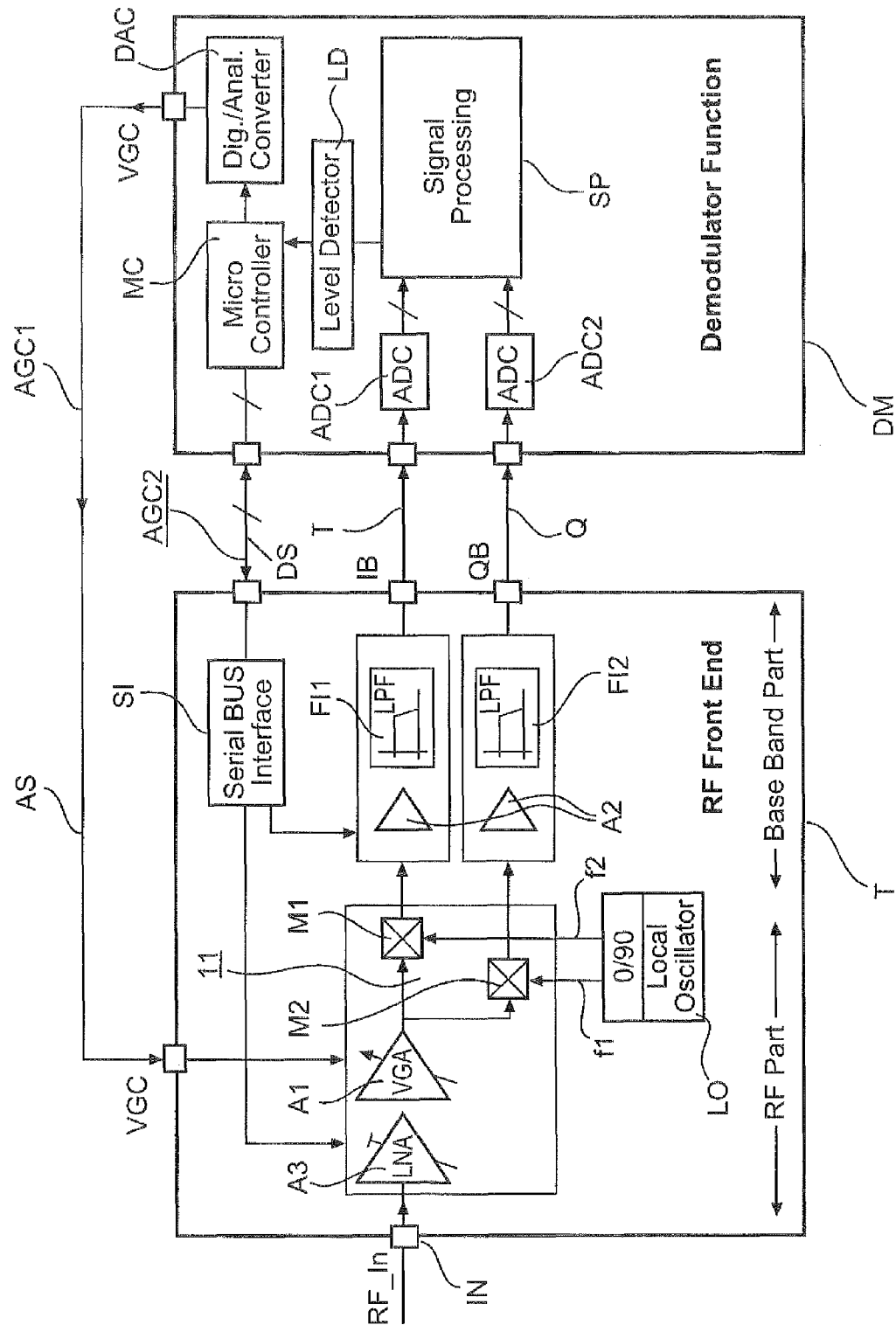

RECEIVER WITH ANALOG AND DIGITAL GAIN CONTROL, AND RESPECTIVE METHOD

This application claims the benefit, under 35 U.S.C. §119 of European Procedure Application 09305574.7, filed Jun. 19, 2009.

TECHNICAL FIELD OF THE INVENTION

The invention relates to a receiver comprising a first gain controlled amplifier, a mixer, a second gain controlled amplifier and a demodulator for demodulating a selected communications channel and for controlling the gain of the two amplifiers. The receiver is in particular designed for receiving digital satellite signals according to a DVB or ABS standard.

BACKGROUND

Present digital satellite receivers usually comprise a tuner with an RF-input stage for receiving a plurality of digital satellite channels, a mixer for selecting and downconverting a wanted satellite channel into an intermediate frequency range or a baseband, and a demodulator, which converts the signal of the selected satellite channel into an appropriate television signal usable for a television set. Widely used are direct conversion satellite receivers, which have the advantage of high circuit integration with a low count for external components.

The mixer of a direct conversion receiver converts a selected television signal directly to a baseband signal, which is subsequently filtered by a baseband lowpass filter, digitized by an analog/digital converter and processed by the demodulator to a digital television signal. The tuner comprises a gain controlled RF amplifier and a gain controlled baseband amplifier, which are controlled by the demodulator for providing a gain variation of at least 50 dB, which is required for providing a high sensitivity of the satellite receiver and for an optimum performance of the demodulator.

BRIEF SUMMARY OF THE INVENTION

The receiver comprises an RF input for receiving a plurality of communications channels, a first amplifier coupled to the RF input, a mixer coupled with an input to the first amplifier for selecting and downconverting a wanted communications channel, a second amplifier coupled with an input to an output of the mixer, an analog gain control for the first amplifier, a digital gain control for the second amplifier, and a digital controller, for example a microcontroller. The digital controller provides a digital gain setting by means of the digital gain control after a selection of the wanted communications channel and provides an analog gain setting by means of the analog gain control during demodulation of the wanted communications channel. The digital gain setting is in particular not changed during reception of the wanted communications channel, so that no digital gain switching occurs. Hence, stepwise variations of the output signal of the second amplifier are avoided during demodulation of the wanted communications channel.

In a preferred embodiment, the receiver is a direct conversion digital satellite receiver for reception of digital television channels and the control range of the digital gain control is at least 50 dB for providing a high input sensitivity for the satellite receiver. The control range of the analog gain control is much smaller, e.g. below 20 dB, which is sufficient for compensating short time variations of the input signal level, which may occur during reception of the wanted television channel, e.g. for compensating changed weather conditions or temperature drifts within the tuner. Because of the lower gain, the analog gain control provides a precise adjustment of the output signal of the second amplifier to allow optimum demodulating performance of the demodulator. Only in case the analog gain control is out of its control range, a new gain calibration is done during which the digital gain control is newly adjusted. Then again, all digital controlled gain stages are kept constant and only the analog gain control is enabled for the operation of the receiver. In addition, a digital bus coupling the microcontroller with the second amplifier is switched off, when the analog gain control is enabled, to avoid any digital distortions of the output signal of the second amplifier.

A method for operating the receiver comprises the steps of receiving a plurality of communications channels, setting the gain of the first amplifier to a defined nominal value, selecting and downconverting a wanted communications channel, changing the gain of the second amplifier step by step by means of the digital gain control and observing the output signal of the second amplifier by means of a level detector, keeping the digital gain control constant when the output signal of the second amplifier is within a defined voltage range, and enabling subsequently the analog gain control for using only the analog gain control of the first amplifier during demodulation of the wanted communications channel.

BRIEF DESCRIPTION OF THE DRAWINGS

Preferred embodiments of the invention are explained in more detail below by way of example with reference to a schematic drawing, which show:

FIGURE a receiver for reception of digital television channels.

DETAILED DESCRIPTION OF PREFERRED EMBODIMENTS

In the FIGURE 1 a receiver is shown comprising a radio frequency input IN, also called RF input, for receiving a high frequency signal, in particular for receiving a plurality of communications channels, and comprising a first amplifier A1, which is coupled with an input to the RF input IN. For selecting and downconverting a wanted communications channel, the receiver comprises a mixer M, in this embodiment a quadrature mixer with a first mixing stage M1 for providing an I component of the input signal, and a second mixing stage M2 for providing a Q component of the input signal. The mixing stages M1, M2 are controlled by a local oscillator LO, which provides a first oscillator signal f1 and a second oscillator signal f2 of same frequency, but with a phase difference of 90°, for downconversion of the selected communications channel.

The receiver is in a preferred embodiment a satellite receiver for a reception of a plurality of digital television channels as provided by a satellite antenna via a low-noise-converter, not shown. The receiver is in particular a digital satellite receiver for a DVB-S, DVBS-S2 and/or ABS-S standard, and by means of the local oscillator LO, a wanted television channel is selected.

The television channel is downconverted into the baseband and amplified by a second amplifier A2, which is coupled with an input to an output of the Mixer M. In this embodiment, the amplifier A2 comprises two inputs and two outputs for amplification of the I and Q signal components. The amplifier A2 provides an amplification of the downconverted signal, which is subsequently filtered by low path filters FI1, FI2. The amplifier A1 is an analog gain controlled amplifier and the amplifier A2 a digital gain controlled amplifier.

The circuit comprising the amplifiers A1, A2, mixer M, local oscillator LO and base band filters FI1, FI2 is usually called a tuner T or RF front end and arranged within a shielded, separate unit. The input section of the tuner T including the mixer M is called the RF part and the output section including the second amplifier A2 and the base band filters FI1, FI2 is called the base band part. The satellite receiver may include in addition a third gain controlled amplifier A3 being arranged between the RF input IN and the first amplifier A1. The third amplifier A3 is usually a low noise amplifier, but instead of an active amplifier, also a damping stage may be arranged between the RF input IN and the amplifier A1.

The receiver includes further a demodulator DM, which is coupled with an input to an output of the second gain controlled amplifier A2 for demodulating the selected communications channel. The receiver comprises further a digital controller, for example a microcontroller MC, which senses via a level detector LD the output signal level of amplifier A2, as received by the demodulator DM, for a gain control of the first and second amplifiers A1 and A2, also of amplifier A3 when included.

In a preferred embodiment, the demodulator DM comprises a first analog/digital converter ADC1, which is coupled with an input to the output of the first baseband filter FI1 and a second analog/digital converter ADC2, which is coupled with an input to the output of the second base band filter FI2, for converting the output signals of the filters FI1, FI2 into digitized signals. The output signals of the analog/digital converters ADC1, ADC2 are provided to a signal processing unit SP, which performs the main demodulating function for the baseband I, Q signals of the selected communications channel, including error correction, for extraction of the wanted signal, e.g. a digital television signal for a use with a television set in case of a digital satellite receiver.

The signal processing unit SP provides in particular also an information for the level detector LD representing the signal strength of the RF input signals as received from the tuner T. The microcontroller MC provides a digital gain control AGC2, e.g. via a serial bus connected to a serial bus interface SI included in the tuner T, for controlling the gain of the second amplifier A2 and also of the third amplifier A3, when included. The serial bus is for example an I2C bus. The serial bus interface SI converts digital control signals DS of the microcontroller MC into gain control signals for the amplifiers A2, A3, for changing the gain of amplifiers A2, A3 e.g. by means of MOSFET switches.

In addition, the microcontroller MC provides an analog gain control AGC1 via a digital/analog converter DAC, which converts a digital control signal of the microcontroller MC into an analog control signal AS for controlling the gain of the first amplifier A1.

The operation of the receiver is as follows: When a user selects a wanted communications channel, a channel tuning is made by the receiver by which one of a plurality of communications channels is selected, e.g. one of a band of digital television channels, downconverted by the mixer M and provided to the demodulator DM. A control signal AS is provided to set the gain of the first amplifier A1 to a defined nominal value and then a digital gain calibration is done by the microcontroller MC by stepwise changing the gain of the second amplifier A2 via the serial bus interface SI. When the level detector LD detects a sufficient signal level of the output signal of amplifier A2, which is e.g. within a wanted voltage range as received by the analog/digital converters ADC1, ADC2, the gain of the amplifier A2 is frozen and kept constant for the operation of the receiver, in particular during demodulation of the wanted communications channel.

When the digital gain is set, the analog gain control AGC1 for the first amplifier Al is enabled by the microcontroller MC to provide an optimum input signal for the operation of the ADCs ADC1 and ADC2 during reception of the wanted communications channel. Thus, all level changes of the input signal IN or any other level changes provided for example by temperature drifts of the tuner T are compensated by varying the analog voltage AS for the first amplifier Al. The control range of the analog gain control AGC1 is e.g. +13 dB/−3 dB relative to a reference level, which is sufficient for optimum operation of the signal processing unit SP in case of a digital satellite receiver. The serial bus interface SI in particular is not operated and can be kept switched off, for not generating any digital noise inside the tuner T, which may inject into the analog circuits of the tuner T. Also any distortions originating from the digital gain setting for the amplifier A2 are avoided.

In case of a digital satellite receiver, the main origin of input level variations is rain fade, which may provide level drops of up to 10 dB, but much more is not likely. Therefore, with a relatively small gain control range of the analog gain control AGC1, the output signal of the tuner can be controlled very precisely for optimum operation of the demodulator DM. The main objective of the analog and digital gain control loops is to deliver the output signals I, Q of the tuner T at always the same voltage level to minimize demodulation errors, with a voltage level having a maximum amplitude being shortly below clipping of the ADCs ADC1, ADC2 to provide optimum use of the ADC resolution and to keep the amplitude of the I/Q signals always well above the quantization noise floor of the ADCs.

For the tuner T, e.g. the tuner ICs STB6000 or STB6100 of the company ST Microelectronics may be used, which are highly integrated direct conversion tuner ICs for DBS television applications. Both allow a digital gain control via a serial $I^2C$ bus interface and an analog gain control of an RF amplifier stage via an additional input pin. For the demodulator DM, e.g. the DVB-S2 demodulator CX24116 of the company CONEXANT may be used, which is a highly integrated demodulator IC for I/Q demodulation, and which comprises two analog/digital converters, a microprocessor, a level detector and a tuner interface for operation of a respective tuner IC.

Alternatively, the receiver may be designed for reception of mobile phone communications channels for application within a mobile phone, or may be designed as a wireless receiver for wireless local area networks (WLAN) or for operation and reception of any further digital communication channels.

Digital gain setting may be implemented e.g. by use of switches, which can be integrated easily by using CMOS-technology. A drawback of all digital gain control solutions is that the output signal from the tuner is disturbed in the moment, when the digital gain switching occurs. This is in particular a problem for a reception of digital television channels, which provide a constant data stream when a wanted television channel has been selected by the user, and any stepwise amplitude variations may lead to decoding errors by the demodulator.

Further, due to the high-path characteristic of the output stage of the tuner, which is caused by AC coupling and/or due to any DC voltage control loop, a short distortion is induced by the stepwise gain setting, which leads to transient waveforms at the output, causing a signal degradation, which will lead to an increased bit error rate. In particular, the DC offset cancellation, necessary for compensating offset voltages caused by the high gain of the amplifier A2, leads to transient waveforms in the millisecond range. Therefore, by using only the analog gain control AGC1 of the receiver during demodulation of a wanted communications channel, but not the digital gain control AGC2, the performance of the receiver is essentially improved. Only additional software for the microcontroller MC is required for implementing the invention.

Also other embodiments of the invention can be provided by a person skilled in the art without departing from the spirit and scope of the present invention. The receiver is in particular not restricted to reception of television channels and may be used also for reception of any other radio frequency communication channels, as known e.g. from mobile phones or wireless digital data transmission. The invention resides therefore in the claims herein after appended.

The invention claimed is:

1. A receiver comprising
   an RF input for receiving a plurality of communications channels,
   a first amplifier coupled to the RF input,
   a mixer coupled to the amplifier for downconverting a wanted communications channel,
   a second amplifier coupled with an input to an output of the mixer,
   a demodulator comprising an analog/digital converter coupled with an input to an output of the second amplifier,
   an analog gain control for the first amplifier and a digital gain control for the second amplifier, and
   a digital controller providing a digital gain setting by means of the digital gain control after a selection of the wanted communications channel, freezing the digital gain setting and providing an analog gain setting by means of the analog gain control after said digital gain setting, so that only the analog gain control and not the digital gain control is enabled and during demodulation of the wanted communications channel.

2. The receiver of claim 1, wherein the digital controller provides a digital gain setting during demodulation of the wanted communications channel only, when the analog gain control is out of its control range.

3. The receiver of claim 1, wherein the digital gain setting is not changed, when the analog gain control is enabled.

4. The receiver of claim 1, wherein the digital controller is coupled via a serial bus to the second amplifier for providing a stepwise gain setting, and wherein the operation of the serial bus is switched off, when the analog gain control is enabled.

5. The receiver of claim 4, wherein the mixer converts the selected communications channel into a baseband, and wherein the first amplifier is a gain controlled RF amplifier and the second amplifier is a gain controlled baseband amplifier.

6. The receiver of claim 5, wherein the first amplifier, the mixer, and the second amplifier are integrated together with a baseband output filter and a local oscillator within an integrated tuner circuit.

7. The receiver of claim 4, wherein the demodulator comprises a signal processing unit coupled to the analog/digital converter for demodulating the selected communications channel and a level detector coupled to the analog/digital converter and to the digital controller.

8. The receiver of claim 7, wherein the digital controller, the analog/digital converter, the level detector and the signal processing unit are integrated together within an integrated demodulator circuit.

9. The receiver of claim 4, wherein the control range of the digital gain control is at least 50 dB and the control range of the analog gain control is less than 20 dB.

10. The receiver of claim 4, being a direct conversion digital satellite receiver for reception of DVB-S, DVB-S2 or ABS-S digital television channels.

11. A method for operating a receiver comprising a first gain controlled amplifier, a mixer coupled with an input to an output of the first amplifier, a second gain controlled amplifier coupled with an input to an output of the mixer, a digital controller and a level detector, with the steps of
   receiving a plurality of communications channels with the first amplifier,
   selecting and downconverting a wanted communications channel by means of the mixer,
   evaluating the signal strength of the output signal of the second amplifier by means of the level detector,
   providing a digital gain setting for the second amplifier after selection of the wanted communications channel by means of the digital controller by changing stepwise the gain of the second amplifier until the output signal of the second amplifier is within a defined voltage range,
   freezing the digital gain setting when the output signal of the second amplifier is within said voltage range,
   enabling an analog gain setting for the first amplifier after freezing of the digital gain setting and demodulating the wanted communications channel,
   using the analog gain setting during demodulation of the wanted communications channel for keeping the output signal of the second amplifier within said defined voltage range, so that only the analog gain control and not the digital gain control is enabled during demodulation of the wanted communications channel.

12. The method of claim 11, further comprising providing a re-calibration of the second amplifier only, when the analog gain setting is out of its control range.

13. The method of claim 11, further comprising switching off the operation of a serial bus coupling the digital controller with the second amplifier, when the analog gain control is enabled.

14. A receiver comprising
   an RF input for receiving a plurality of communications channels,
   a first amplifier coupled to the RF input,
   a mixer coupled to the amplifier for downconverting a wanted communications channel,
   a second amplifier coupled with an input to an output of the mixer,
   a demodulator coupled with an input to an output of the second amplifier,
   an analog gain control for the first amplifier and a digital gain control for the second amplifier, and
   a digital controller providing a digital gain setting by means of the digital gain control after a selection of the wanted communications channel, freezing the digital gain setting and providing an analog gain setting by means of the analog gain control after said digital gain setting and during demodulation of the wanted communications channel
   wherein the control range of the digital gain control is at least 50 dB and the control range of the analog gain control is less than 20 dB.

* * * * *

UNITED STATES PATENT AND TRADEMARK OFFICE
CERTIFICATE OF CORRECTION

PATENT NO. : 8,428,202 B2  
APPLICATION NO. : 12/818326  
DATED : April 23, 2013  
INVENTOR(S) : Braicu et al.

Page 1 of 1

It is certified that error appears in the above-identified patent and that said Letters Patent is hereby corrected as shown below:

In the Claims:

Column 5 - Claim 1:

Line 37 should state: "digital gain control is enabled during demodulation".

Signed and Sealed this
Twenty-third Day of July, 2013

Teresa Stanek Rea
*Acting Director of the United States Patent and Trademark Office*